(12) United States Patent
Yu

(10) Patent No.: US 6,423,647 B1
(45) Date of Patent: Jul. 23, 2002

(54) FORMATION OF DIELECTRIC REGIONS OF DIFFERENT THICKNESSES AT SELECTIVE LOCATION AREAS DURING LASER THERMAL PROCESSES

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 09/734,291

(22) Filed: Dec. 11, 2000

(51) Int. Cl.⁷ ................................................ H01L 21/31
(52) U.S. Cl. ...................... 438/758; 438/765; 438/795; 438/770
(58) Field of Search ................................ 438/770, 795, 438/759, 758, 771, 765

(56) References Cited

U.S. PATENT DOCUMENTS

| | | | | |
|---|---|---|---|---|
| 5,718,991 A | * | 2/1998 | Lin et al. | 430/5 |
| 5,904,575 A | * | 5/1999 | Ishida et al. | 438/770 |
| 6,319,759 B1 | * | 11/2001 | Furukawa et al. | 438/151 |

\* cited by examiner

*Primary Examiner*—Caridad Everhart
(74) *Attorney, Agent, or Firm*—Monica H. Choi

(57) ABSTRACT

For fabricating regions of dielectric material on a semiconductor substrate, a first layer of metal is deposited on the semiconductor substrate, and a first opening is etched through the first layer of metal at a first location area on the semiconductor substrate. First laser beams having a first laser power are directed toward the semiconductor substrate to form a first region of dielectric material having a first thickness at the first location area on the semiconductor substrate. The first layer of metal reflects the first laser beams away from the semiconductor substrate except at the first location area, and the first thickness of the first region of dielectric material is determined by the first laser power of the first laser beams. The first layer of metal is removed from the semiconductor substrate. A second layer of metal is then deposited on the semiconductor substrate, and a second opening is etched through the second layer of metal at a second location area on the semiconductor substrate. Second laser beams having a second laser power is directed toward the semiconductor substrate to form a second region of dielectric material having a second thickness at the second location area on the semiconductor substrate. The second layer of metal reflects the second laser beams away from the semiconductor substrate except at the second location area, and the second thickness of the second region of dielectric material is determined by the second laser power of the second laser beams. The second layer of metal is then removed from the semiconductor substrate. The present invention may be used to particular advantage when the first thickness of the first region of dielectric material is different from the second thickness of the second region of dielectric material.

8 Claims, 4 Drawing Sheets

FORMATION OF DIELECTRIC REGIONS OF DIFFERENT THICKNESSES AT SELECTIVE LOCATION AREAS DURING LASER THERMAL PROCESSES

TECHNICAL FIELD

The present invention relates generally to fabrication of integrated circuits, and more particularly, to fabrication of dielectric regions of different thicknesses by controlling the laser power used for forming a respective dielectric at each of selective location areas defined by a respective opening through a respective layer of metal during laser thermal processes.

BACKGROUND OF THE INVENTION

The present invention is described for fabricating dielectric regions of different thicknesses for gate dielectrics of field effect transistors having different threshold voltages. However, the present invention may be advantageously used for fabricating dielectric regions of different thicknesses for other integrated circuit applications, as would be apparent to one of ordinary skill in the art of integrated circuit fabrication from the description herein.

Referring to FIG. 1, a common component of a monolithic IC is a MOSFET (Metal Oxide Semiconductor Field Effect Transistor) 100 which is fabricated within a semiconductor substrate 102. The MOSFET 100 includes a drain extension junction 104 and a source extension junction 106 formed within an active device area 126 of the semiconductor substrate 102. The drain extension junction 104 and the source extension junction 106 are relatively shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

MOSFETs with different threshold voltages in an integrated circuit may be desired. For example, a MOSFET operating with lower bias voltages for low power applications is desired to have a low threshold voltage to ensure that the MOSFET turns on with such lower bias voltages. On the other hand, a MOSFET operating with higher bias voltages for enhanced speed performance is desired to have a higher threshold voltage to ensure that the gate dielectric 116 does not break down with such higher bias voltages. The thickness of the gate dielectric 116 determines the threshold voltage of the MOSFET 100 with a thinner gate dielectric 116 resulting in a lower threshold voltage, as known to one of ordinary skill in the art of integrated circuit fabrication.

Because MOSFETs with different threshold voltages may be desired for an integrated circuit fabricated on a semiconductor substrate, a mechanism is desired for fabricating gate dielectrics of different thicknesses on the semiconductor substrate.

SUMMARY OF THE INVENTION

Accordingly, in a general aspect of the present invention, dielectric regions of different thicknesses are fabricated by controlling the laser power used for forming a respective dielectric at each of selective location areas defined by a respective opening through a respective layer of metal during laser thermal processes.

In one embodiment of the present invention, in a method for fabricating regions of dielectric material on a semiconductor substrate, a first layer of metal is deposited on the semiconductor substrate, and a first opening is etched through the first layer of metal at a first location area on the semiconductor substrate. First laser beams having a first laser power are directed toward the semiconductor substrate to form a first region of dielectric material having a first thickness at the first location area on the semiconductor substrate. The first layer of metal reflects the first laser beams away from the semiconductor substrate except at the first location area, and the first thickness of the first region of dielectric material is determined by the first laser power of the first laser beams. The first layer of metal is removed from the semiconductor substrate.

A second layer of metal is then deposited on the semiconductor substrate, and a second opening is etched through the second layer of metal at a second location area on the semiconductor substrate. Second laser beams having a second laser power are directed toward the semiconductor substrate to form a second region of dielectric material having a second thickness at the second location area on the semiconductor substrate. The second layer of metal reflects the second laser beams away from the semiconductor substrate except at the second location area, and the second thickness of the second region of dielectric material is determined by the second laser power of the second laser beams. The second layer of metal is then removed from the semiconductor substrate.

The present invention may be used to particular advantage when the semiconductor substrate is comprised of silicon, when the first region of dielectric material and the second region of dielectric material are comprised of silicon dioxide ($SiO_2$), when the layer of metal is comprised of aluminum, and when the first laser beams and the second laser beams have a wavelength of about 308 nm (nanometers).

In addition, in one embodiment of the present invention, the first laser power of the first laser beams is less than the second laser power of the second laser beams such that the first thickness of the first region of dielectric material is less than the second thickness of the second region of dielectric material. In that case, the present invention may be used to particular advantage when the first region of dielectric material forms a gate dielectric of a first field effect transistor having a first threshold voltage, and when the second region of the dielectric material forms a gate dielectric of a second field effect transistor having a second threshold voltage, such that the first threshold voltage of the first field effect transistor is lower than the second threshold voltage of the second field effect transistor.

In this manner, by oxidizing the semiconductor substrate at selective location areas defined by a respective opening through a respective layer of metal in a laser thermal process with variation of the laser power, multiple location areas of gate dielectrics of different thicknesses may be formed for field effect transistors with different threshold voltages of an integrated circuit.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 1:
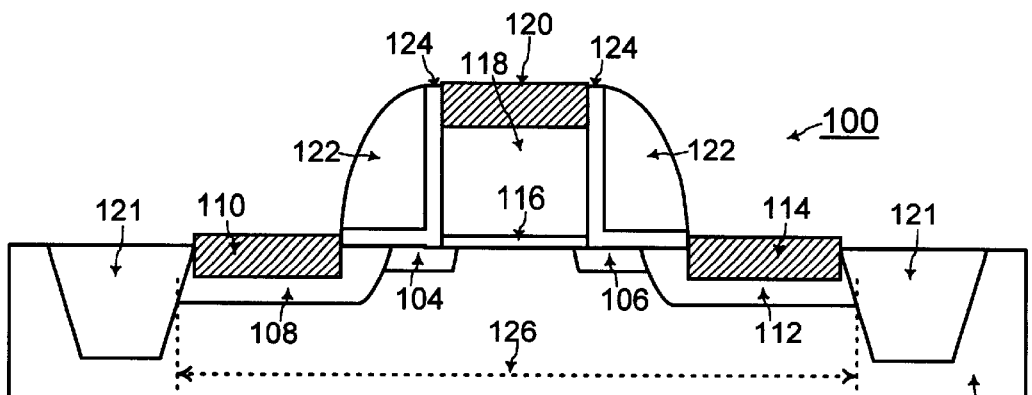
FIG. 1 shows a cross-sectional view of a MOSFET (Metal Oxide Semiconductor Field Effect Transistor)
Figure 2:
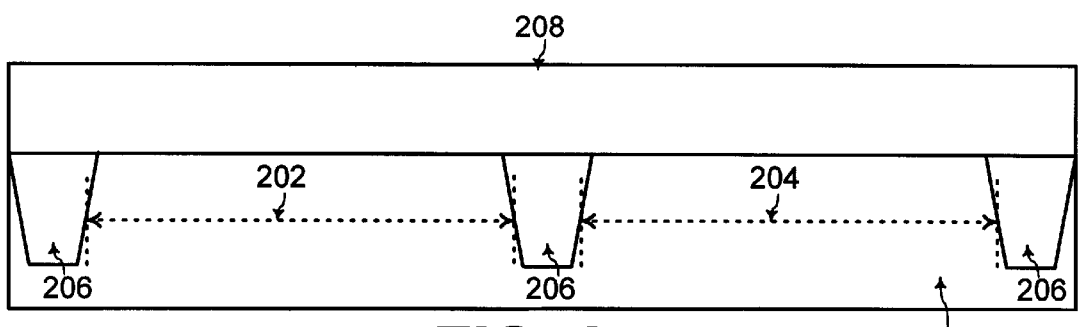
FIGS. 2, 3, 4, 5, 6, 7, 8, 9, and 10 show cross-sectional views for illustrating the steps for fabricating dielectric regions of different thicknesses by controlling the laser power used for forming a respective dielectric at each of selective location areas defined by a respective opening through a respective layer of metal during laser thermal processes, according to an embodiment of the present invention.

In the cross-sectional view of FIG. 2, a first active device area 202 and a second active device area 204 are formed in a semiconductor substrate 205 by STI (shallow trench isolation) structures 206. The semiconductor substrate 205 is comprised of silicon in one embodiment of the present invention. STI (shallow trench isolation) technology for electrical isolation of an active device area is known to one of ordinary skill in the art of integrated circuit fabrication.

Further referring to FIG. 2, a first layer of metal 208 is deposited on the semiconductor substrate 205. The first layer of metal 208 is comprised of aluminum having a thickness in a range of from about 2000 Å (angstroms) to about 5000 Å (angstroms) according to one embodiment of the present invention. Processes for deposition of such a first layer of metal 208 are known to one of ordinary skill in the art of integrated circuit fabrication.

Figure 3:
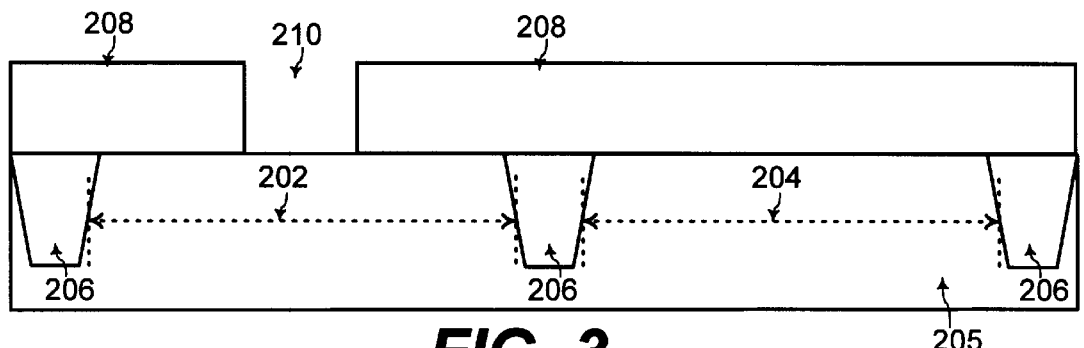

Referring to FIG. 3, a first opening 210 is etched through the first layer of metal 208 at a first location area of the semiconductor substrate 205. The first opening 210 exposes the first location area in the first active device area 202 of the semiconductor substrate 205. Processes for patterning and etching the first opening 210 through the first layer of metal 208 using photolithography processes for example are known to one of ordinary skill in the art of integrated circuit fabrication.

Figure 4:
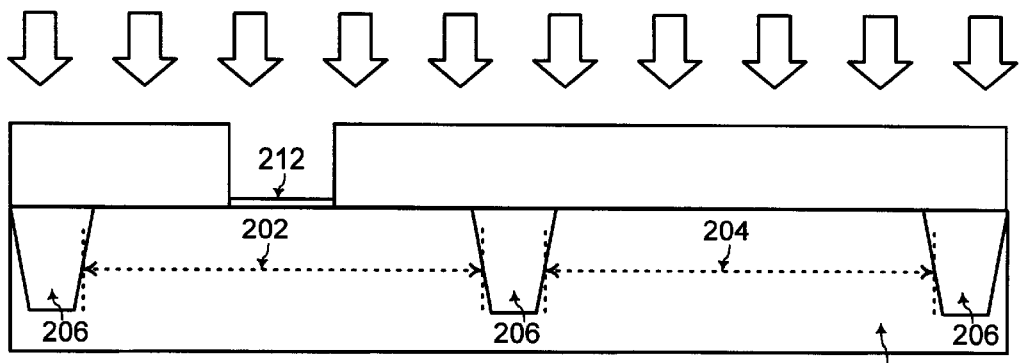

Referring to FIG. 4, first laser beams (illustrated by the arrows in FIG. 4) are directed toward the semiconductor substrate 205 within a laser thermal oxidation system. In a laser thermal oxidation system, laser beams are directed toward the semiconductor substrate to heat up the semiconductor substrate with oxygen introduced into the system to form silicon dioxide ($SiO_2$) on the semiconductor substrate. The laser beams may have a wavelength of about 308 nm (nanometers) in one embodiment of the present invention. The thickness of the silicon dioxide formed on the semiconductor substrate is controlled by varying the power of the laser beams directed toward the semiconductor substrate. Such a laser thermal oxidation system is known to one of ordinary skill in the art of integrated circuit fabrication and is commercially available to one of ordinary skill in the art of integrated circuit fabrication for example from Verdent Technology, Inc. located in San Jose, Calif.

Referring to FIG. 4, the first laser beams heat up the semiconductor substrate 205 to form a first region of dielectric material 212 having a first thickness at the first location area of the first opening 210. When the first laser beams are from a laser thermal oxidation system, the first region of dielectric material 212 is comprised of silicon dioxide ($SiO_2$). The first laser power of the first laser beams is controlled to determine the first thickness of the first region of dielectric material 212. For example, the amplitude parameter or the time duration of application of the first laser beams may be controlled to vary the power of the first laser beams applied on the semiconductor substrate 205. Preferably, the first laser power of the first laser beams is not sufficient to melt the first layer of metal 208 during formation of the first region of dielectric material 212.

Further referring to FIG. 4, in a general aspect of the present invention, the first layer of metal 208 reflects the first laser beams away from the semiconductor substrate 205 and covers the semiconductor substrate 205 from being exposed to oxygen such that dielectric material is not formed on the semiconductor substrate 205 except at the first location area of the first opening 210 through the first layer of metal 208. Thus, the first region of dielectric material 212 is selectively formed only at the first location area of the first opening 210 through the first layer of metal 208.

Figure 5:
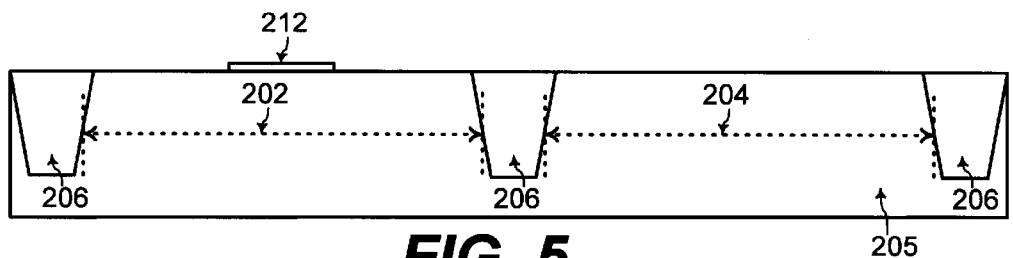

Referring to FIG. 5, the first layer of metal 208 is removed from the semiconductor substrate 205. Processes for removing the first layer of metal 208, which may be comprised of aluminum for example, from the semiconductor substrate 205 are known to one of ordinary skill in the art of integrated circuit fabrication.

Figure 6:
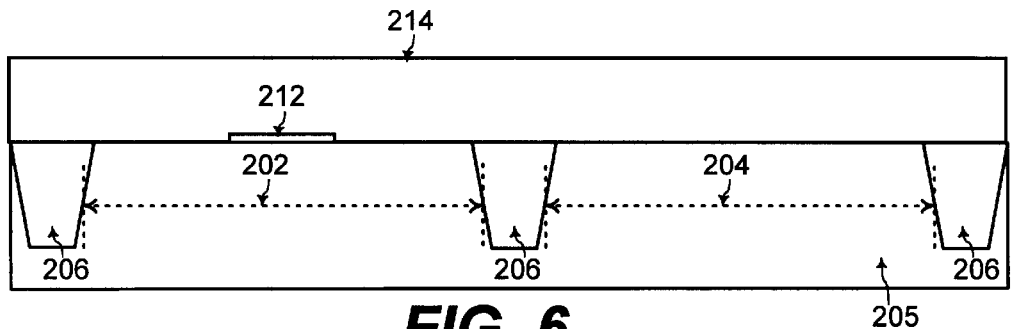

Referring to FIG. 6, a second layer of metal 214 is deposited on the semiconductor substrate 205. The second layer of metal 214 is comprised of aluminum having a thickness in a range of from about 2000 Å (angstroms) to about 5000 Å (angstroms) according to one embodiment of the present invention. Processes for deposition of such a second layer of metal 214 are known to one of ordinary skill in the art of integrated circuit fabrication.

Figure 7:
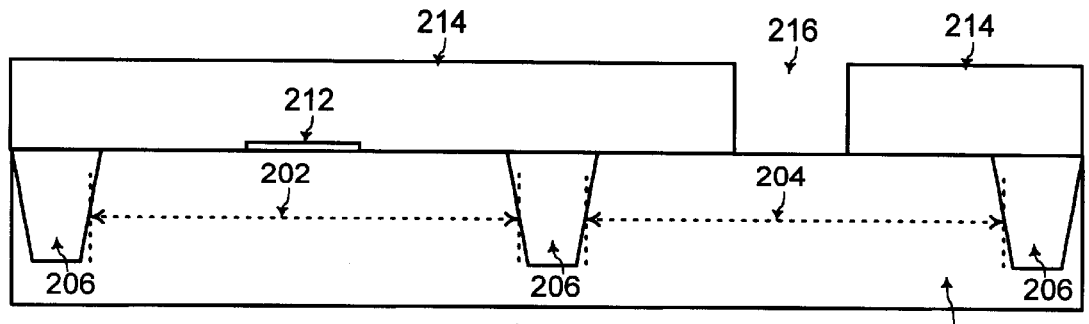

Referring to FIG. 7, a second opening 216 is etched through the second layer of metal 214 at a second location area of the semiconductor substrate 205. The second opening 216 exposes the second location area in the second active device area 204 of the semiconductor substrate 205. Processes for patterning and etching the second opening 216 through the second layer of metal 214 using photolithography processes for example are known to one of ordinary skill in the art of integrated circuit fabrication.

Figure 8:
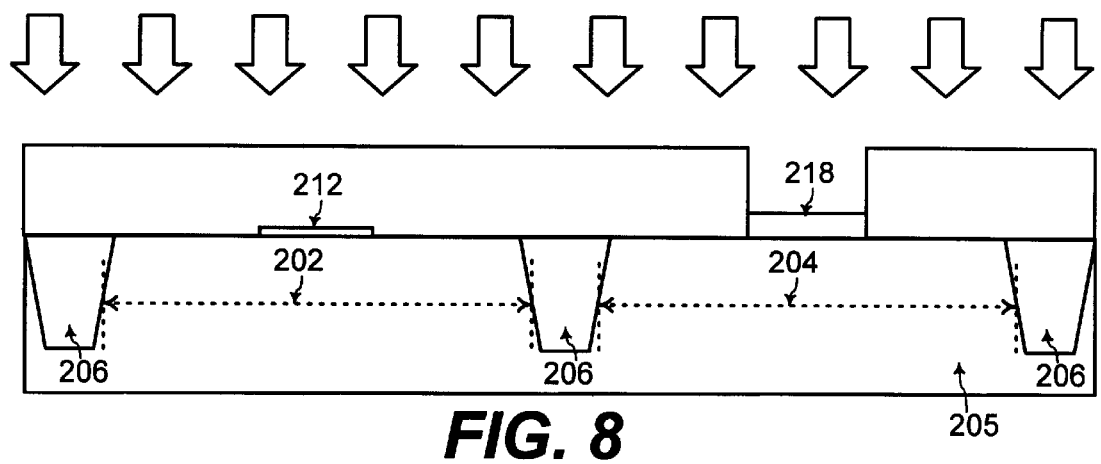

Referring to FIG. 8, second laser beams (illustrated by the arrows in FIG. 8) are directed toward the semiconductor substrate 205 within a laser thermal oxidation system. In a laser thermal oxidation system, laser beams are directed toward the semiconductor substrate to heat up the semiconductor substrate with oxygen introduced into the system to form silicon dioxide (SiO$_2$) on the semiconductor substrate. The laser beams may have a wavelength of about 308 nm (nanometers) in one embodiment of the present invention. The thickness of the silicon dioxide formed on the semiconductor substrate is controlled by varying the power of the laser beams directed toward the semiconductor substrate. Such a laser thermal oxidation system is known to one of ordinary skill in the art of integrated circuit fabrication and is commercially available to one of ordinary skill in the art of integrated circuit fabrication for example from Verdent Technology, Inc. located in San Jose, Calif.

Referring to FIG. 8, the second laser beams heat up the semiconductor substrate 205 to form a second region of dielectric material 218 having a second thickness at the second location area of the second opening 216. When the second laser beams are from a laser thermal oxidation system, the second region of dielectric material 218 is comprised of silicon dioxide (SiO$_2$). The second laser power of the second laser beams is controlled to determine the second thickness of the second region of dielectric material 218. For example, the amplitude parameter or the time duration of application of the second laser beams may be controlled to vary the power of the second laser beams applied on the semiconductor substrate 205. Preferably, the second laser power of the second laser beams is not sufficient to melt the second layer of metal 214 during formation of the second region of dielectric material 218.

In one embodiment of the present invention, the second laser power of the second laser beams for forming the second region of dielectric material 218 in FIG. 8 is higher than the first laser power of the first laser beams for forming the first region of dielectric material 212 in FIG. 4. In that case, the second thickness of the second region of dielectric material 218 is higher than the first thickness of the first region of dielectric material 212.

Further referring to FIG. 8, in a general aspect of the present invention, the second layer of metal 214 reflects the second laser beams away from the semiconductor substrate 205 and covers the semiconductor substrate 205 from being exposed to oxygen such that dielectric material is not formed on the semiconductor substrate 205 except at the second location area of the second opening 216 through the second layer of metal 214. Thus, the second region of dielectric material 218 is selectively formed only at the second location area of the second opening 216 through the second layer of metal 214.

Figure 9:
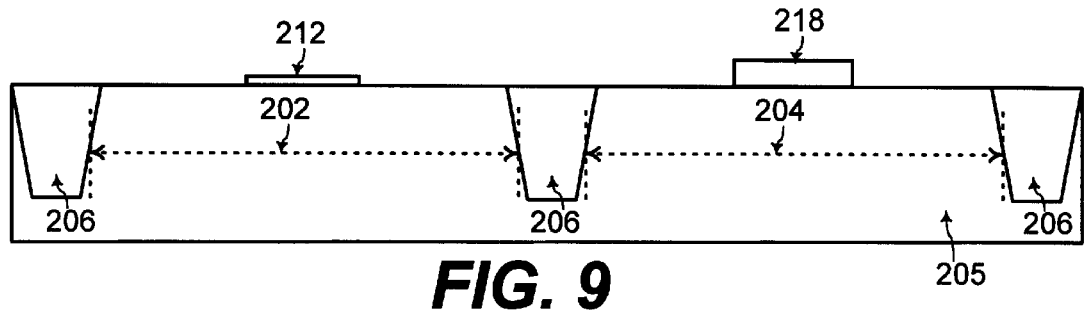

Referring to FIG. 9, the second layer of metal 214 is removed from the semiconductor substrate 205. Processes for removing the second layer of metal 214, which may be comprised of aluminum for example, from the semiconductor substrate 205 are known to one of ordinary skill in the art of integrated circuit fabrication.

Figure 10:
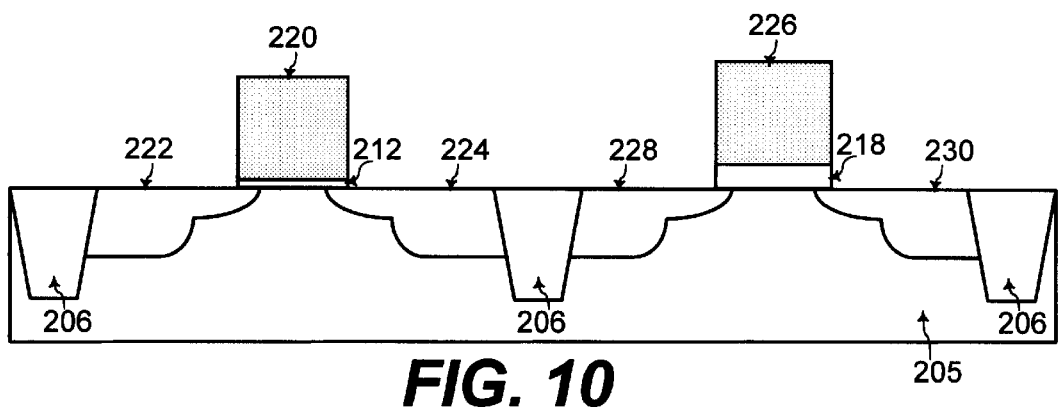

Referring to FIG. 10, in one application of the present invention, the first region of dielectric material 212 may be a gate dielectric of a first MOSFET (Metal Oxide Semiconductor Field Effect Transistor) formed in the first active device area 202 of the semiconductor substrate 205. In that case, a first gate structure 220 is formed on the first region of dielectric material 212, and a first drain region 222 and a first source region 224 are formed in the first active device area 202 of the semiconductor substrate 205. In addition, the second region of dielectric material 218 is a gate dielectric of a second MOSFET (Metal Oxide Semiconductor Field Effect Transistor) formed in the second active device area 204 of the semiconductor substrate 205. In that case, a second gate structure 226 is formed on the second region of dielectric material 218, and a second drain region 228 and a second source region 230 are formed in the second active device area 204 of the semiconductor substrate 205.

In the case when the first thickness of the first region of dielectric material 212 is less than the second thickness of the second region of dielectric material 218, the threshold voltage of the first MOSFET having the first region of dielectric material 212 as the gate dielectric is lower than the threshold voltage of the second MOSFET having the second region of dielectric material 218 as the gate dielectric. In this manner, field effect transistors with different threshold voltages are formed for an integrated circuit on the semiconductor substrate 205. For example, the first MOSFET with the lower threshold voltage may be for operating with lower bias voltages for low power applications to ensure that the first MOSFET turns on with such lower bias voltages. On the other hand, the second MOSFET with higher threshold voltage may be for operating with higher bias voltages for enhanced speed performance to ensure that the gate dielectric does not break down with such higher bias voltages.

The foregoing is by way of example only and is not intended to be limiting. For example, the present invention is described for fabricating dielectric regions of different thicknesses for gate dielectrics of field effect transistors having different threshold voltages. However, the present invention may be advantageously used for fabricating dielectric regions of different thicknesses for other integrated circuit applications, as would be apparent to one of ordinary skill in the art of integrated circuit fabrication from the description herein. Furthermore, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating regions of dielectric material on a semiconductor substrate, the method including the steps of:

A. depositing a first layer of metal on said semiconductor substrate;

B. etching a first opening through said first layer of metal at a first location area on said semiconductor substrate;

C. directing first laser beams having a first laser power toward said semiconductor substrate to form a first region of dielectric material having a first thickness at said first location area on said semiconductor substrate, wherein said first layer of metal reflects said first laser beams away from said semiconductor substrate except at said first location area, and wherein said first thickness of said first region of dielectric material is determined by said first laser power of said first laser beams;

wherein said first layer of metal contacts and covers areas of said semiconductor substrate not exposed through said first opening during formation of said first region of dielectric material;

D. removing said first layer of metal from said semiconductor substrate;

E. depositing a second layer of metal on said semiconductor substrate;

F. etching a second opening through said second layer of metal at a second location area on said semiconductor substrate;

G. directing second laser beams having a second laser power toward said semiconductor substrate to form a second region of dielectric material having a second thickness at said second location area on said semiconductor substrate, wherein said second layer of metal reflects said second laser beams away from said semiconductor substrate except at said second location area, and wherein said second thickness of said second region of dielectric material is determined by said second laser power of said second laser beams; and wherein said second layer of metal contacts and covers areas of said semiconductor substrate not exposed through said second opening during formation of said second region of dielectric material;

H. removing said second layer of metal from said semiconductor substrate.

2. The method of claim 1, wherein said semiconductor substrate is comprised of silicon, and wherein said first region of dielectric material and said second region of dielectric material are comprised of silicon dioxide ($SiO_2$).

3. The method of claim 1, wherein said first laser power of said first laser beams is less than said second laser power of said second laser beams such that said first thickness of said first region of dielectric material is less than said second thickness of said second region of dielectric material.

4. The method of claim 3, wherein said first region of dielectric material forms a gate dielectric of a first field effect transistor having a first threshold voltage, and wherein said second region of said dielectric material forms a gate dielectric of a second field effect transistor having a second threshold voltage, and wherein said first threshold voltage of said first field effect transistor is lower than said second threshold voltage of said second field effect transistor.

5. The method of claim 1, wherein said first region of dielectric material forms a gate dielectric of a first field effect transistor having a first threshold voltage, and wherein said second region of said dielectric material forms a gate dielectric of a second field effect transistor having a second threshold voltage.

6. The method of claim 1, wherein said layer of metal is comprised of aluminum having a thickness in a range of from about 2000 Å (angstroms) to about 5000 Å (angstroms).

7. The method of claim 1, wherein said first laser beams and said second laser beams have a wavelength of about 308 nm (nanometers).

8. A method for fabricating regions of silicon dioxide ($SiO_2$) on a semiconductor substrate comprised of silicon, the method including the steps of:

A. depositing a first layer of aluminum having a thickness in a range of from about 2000 Å (angstroms) to about 5000 Å (angstroms) on said semiconductor substrate;

B. etching a first opening through said first layer of aluminum at a first location area on said semiconductor substrate;

C. directing first laser beams with a wavelength of about 308 nm (nanometers) having a first laser power toward said semiconductor substrate to form a first region of silicon dioxide ($SiO_2$) having a first thickness at said first location area on said semiconductor substrate, wherein said first layer of aluminum reflects said first laser beams away from said semiconductor substrate except at said first location area, and wherein said first thickness of said first region of silicon dioxide is determined by said first laser power of said first laser beams;

wherein said first layer of aluminum contacts and covers areas of said semiconductor substrate not exposed through said first opening during formation of said first region of silicon dioxide;

D. removing said first layer of aluminum from said semiconductor substrate;

E. depositing a second layer of aluminum having a thickness in a range of from about 2000 Å (angstroms) to about 5000 Å (angstroms) on said semiconductor substrate;

F. etching a second opening through said second layer of aluminum at a second location area on said semiconductor substrate;

G. directing second laser beams with a wavelength of about 308 nm (nanometers) having a second laser power toward said semiconductor substrate to form a second region of silicon dioxide ($SiO_2$) having a second thickness at said second location area on said semiconductor substrate, wherein said second layer of aluminum reflects said second laser beams away from said semiconductor substrate except at said second location area, and wherein said second thickness of said second region of silicon dioxide is determined by said second laser power of said second laser beams; and wherein said second layer of aluminum contacts and covers areas of said semiconductor substrate not exposed through said second opening during formation of said second region of silicon dioxide;

H. removing said second layer of aluminum from said semiconductor substrate;

wherein said first laser power of said first laser beams is less than said second laser power of said second laser beams such that said first thickness of said first region of dielectric material is less than said second thickness of said second region of dielectric material;

and wherein said first region of dielectric material forms a gate dielectric of a first field effect transistor having a first threshold voltage, and wherein said second region of said dielectric material forms a gate dielectric of a second field effect transistor having a second threshold voltage, and wherein said first threshold voltage of said first field effect transistor is lower than said second threshold voltage of said second field effect transistor.

* * * * *